United States Patent
Steele et al.

(10) Patent No.: US 9,625,557 B2
(45) Date of Patent: Apr. 18, 2017

(54) WORK FUNCTION CALIBRATION OF A NON-CONTACT VOLTAGE SENSOR

(71) Applicants: M. Brandon Steele, Decatur, GA (US); Steven R. Soss, Cornwall, NY (US)

(72) Inventors: M. Brandon Steele, Decatur, GA (US); Steven R. Soss, Cornwall, NY (US)

(73) Assignee: QCEPT INVESTMENTS, LLC, Atlanta, GA (US)

( * ) Notice: Subject to any disclaimer, the term of this patent is extended or adjusted under 35 U.S.C. 154(b) by 328 days.

(21) Appl. No.: 14/285,059

(22) Filed: May 22, 2014

(65) Prior Publication Data

US 2015/0338494 A1    Nov. 26, 2015

(51) Int. Cl.
*G01R 35/00* (2006.01)
*G01R 31/265* (2006.01)

(52) U.S. Cl.
CPC ......... *G01R 35/005* (2013.01); *G01R 31/265* (2013.01)

(58) Field of Classification Search
CPC ................ G01R 35/005; G01R 31/265; G01R 31/302–31/315
USPC .................................................... 324/750.02
See application file for complete search history.

(56) References Cited

U.S. PATENT DOCUMENTS

| | | | |
|---|---|---|---|
| 4,973,910 A | 11/1990 | Wilson | |
| 5,136,247 A | 8/1992 | Hansen | |
| 6,909,291 B1 | 6/2005 | Xu et al. | |
| 7,110,238 B1 | 9/2006 | Xu et al. | |
| 2003/0132376 A1 | 7/2003 | Bonnell et al. | |
| 2008/0162066 A1 | 7/2008 | Steele et al. | |

FOREIGN PATENT DOCUMENTS

| | | |
|---|---|---|
| CN | 101069092 | 11/2007 |
| TW | 200526949 | 8/2015 |

OTHER PUBLICATIONS

Taiwanese Office action for Application No. 104115761, dated Mar. 3, 2016, 8 pages.
International Search Report and Written Opinion for Application No. PCT/US15/31925, Mailed Aug. 19, 2015, 7 pages.
Hansen, et al., "Absolute half-cell potential: A simple direct measurement," Physical Review A, vol. 26, No. 3, Aug. 1, 1987, 7 pages.

*Primary Examiner* — Melissa Koval
*Assistant Examiner* — Rahul Maini
(74) *Attorney, Agent, or Firm* — Foley & Lardner LLP

(57) ABSTRACT

A method and a system for calibrating the work function or surface potential of a non-contact voltage sensor probe tip. The method includes preparing one or more reference sample surfaces and a reference non-contact voltage sensor probe tip to have stable surface potentials, measuring the voltage between the reference samples and the reference sensor probe tip, measuring the voltage between a point on a non-reference sample surface and the reference sensor probe tip, measuring the voltage between the same point on the non-reference sample surface and a non-reference non-contact voltage sensor probe tip, and determining a surface potential correction factor for the non-reference, non-contact voltage sensor.

10 Claims, 6 Drawing Sheets

WORK FUNCTION CALIBRATION OF A NON-CONTACT VOLTAGE SENSOR

FIELD OF THE INVENTION

The present invention is directed to methods and systems for the measurement of work functions and surface potentials of materials. More particularly, the present invention is directed to methods and systems for making accurate and repeatable surface potential measurements using a non-contact voltage sensor by employing work function calibration of the non-contact voltage sensor.

BACKGROUND OF THE INVENTION

The function, reliability and performance of microelectronic devices depend on the use of materials and surfaces that have known properties and meet predetermined specifications. Billions of dollars and countless man-hours have been spent developing the systems and processes used to manufacture microelectronics. In order to characterize and optimize these processes and the resulting materials, it is necessary to measure a wide variety of material properties.

One important characteristic of a conducting or semiconducting material is its work function. The work function is the minimum energy required to remove an electron from a material to a noninteracting point above the surface. Herein, we will define work function to take account of and include all factors that influence the electrical potential of a surface, including band bending, interface charges, and charges in or on a dielectric film. In this case, the work function is determined by the electrical potential difference between the Fermi level of electrons inside a conductive or semiconductive material and the electrical potential of a point outside the surface of the top film in a film stack on the material. Using this definition, the work function of a surface varies with the surface potential, and these terms will be used interchangeably to refer to the same property of a surface.

Surface potential is extremely sensitive to surface condition; and surface potential measurements can be used to detect changes in surface condition, such as contamination or electrostatic charging of dielectric films. It is particularly important to measure and control the surface potential of films used in the fabrication of transistor gate stacks. The surface potentials of these surfaces affect important device characteristics such as the threshold voltages of transistors.

One common method of measuring the electrical potential of a surface utilizes a non-contact voltage sensor to measure the electrical potential difference that forms between the sensor probe tip and a surface when the sensor and surface are electrically connected. This voltage is called the Contact Potential Difference (CPD), and it is simply the difference in the surface potentials of the probe tip and surface. If the surface potential of the probe tip is known, then the surface potential of the measured surface can be determined from the measured voltage difference as:

$$V_{surf} = V_{probe} + V_{CPD} \quad (1)$$

where $V_{surf}$ is the surface potential of the measured surface, $V_{probe}$ is the surface potential of the sensor probe tip, and $V_{CPD}$ is the measured CPD.

Non-contact voltage sensors can take many forms. These include vibrating Kelvin probes and Monroe probes. Both Kelvin and Monroe probes utilize a conductive probe tip that is positioned close to the measured surface. The probe tip is electrically connected to the surface, and the probe and the surface form a capacitor. The voltage that forms across this capacitor is equal to the difference in surface potentials between the probe tip and measured surface. This voltage is the Contact Potential Difference mentioned earlier. In order to measure the CPD between the probe tip and the surface, the capacitance between the probe tip and surface is varied. In the case of a Kevin probe, the capacitance is varied by vibrating the probe tip perpendicular to the surface. In the case of a Monroe probe, the capacitance is varied by vibrating a shutter between the probe tip and the surface. When the capacitance between the probe tip and sensor changes, a current is generated into the probe tip. The CPD can be determined by varying the capacitance between the probe tip and surface, monitoring the current into the probe tip, and varying a bias voltage applied to either the probe tip or surface. The bias voltage that results in no current into the probe tip is equal to the negative of the CPD between the probe tip and surface.

The charge on a noncontact voltage sensor is given by the equation for a capacitor:

$$Q = CV \quad (2)$$

Where Q is the charge on the probe tip, C is the capacitance between the probe tip and the measured surface, and V is the voltage between the probe tip and the surface.

The current, i, into the probe tip is the derivative of the charge on the probe tip and is given by the following formula:

$$i = \frac{dQ}{dt} = C\frac{dV}{dt} + V\frac{dC}{dt} \quad (3)$$

The current is the sum of two terms: the CdV/dt term and the VdC/dt term. The C(dV/dt) term results from changes in the voltage between the probe tip and the measured surface, and the V(dC/dt) term results from changes in the capacitance between the probe tip and the measured surface. The CPD and bias voltage between the probe tip and measured surface are assumed to be constant during the measurement, so the dV/dt term is equal to 0. In this case, the current into the probe tip is solely the result of the changing capacitance between the probe tip and surface as follows:

$$i = (V_{CPD} + V_{Bias})\frac{dC}{dt} \quad (4)$$

where $V_{CPD}$ is the Contact Potential Difference between the probe tip and measured surface, and $V_{Bias}$ is the applied bias voltage. When $V_{Bias} = -V_{CPD}$, the voltage is 0 and the current into the probe tip is also 0.

A noncontact voltage sensor can be used to measure the CPD between the noncontact voltage sensor probe tip and a surface. In order to determine the electrical potential of the surface, it is necessary to know the surface potential of the probe tip. If the surface potential of the probe tip is known, then the potential of a surface can be determined by measuring the CPD between the probe tip and the surface, and then calculating the potential of the surface using Equation 1.

One of the biggest challenges in making accurate and repeatable surface potential measurements using a noncontact voltage sensor is determining the surface potential of the sensor probe tip. One method of determining the probe tip potential is to measure the CPD between the probe tip and some reference surface with a known work function or surface potential, and then calculating the probe tip surface potential using Equation 1. However, it is difficult to create a surface with a known surface potential in air. The work function of a surface is extremely sensitive to surface condition. A gaseous environment can interact with a surface and cause its work function, and hence its surface potential, to change over time. The work function of a surface can be affected by oxidation, adsorption of airborne molecular contaminants such as water vapor, or other chemical reactions. These effects can cause the electrical potential of a surface to vary by 10's or 100's of millivolts over a period ranging from minutes to weeks or longer.

One of the most accurate surface potential reference surfaces is created by an electrochemical half cell. An electrochemical half cell consists of an electrode and an electrolyte solution. The half cell has a characteristic potential that is determined by several factors including the electrode material, the preparation of the electrode, the electrolyte in contact with the electrode, and the electrolyte concentration. Under certain conditions, the half cell electrical potential is highly repeatable and stable. Further, a dilute electrolyte solution in electrical contact with the half cell has a surface potential that is equivalent to the half cell potential, so the surface of this electrolyte solution provides a stable and repeatable surface potential reference. The dilute electrolyte solution provides a clean liquid surface that can be created by emptying and refilling a reservoir with fresh solution. However, liquid half cell references require periodic refilling, so they are relatively difficult to handle and automate in a factory environment. For this reason, liquid half cell references are not well suited to frequent calibrations in an industrial environment.

An alternative to frequently recalibrating the surface potential of a noncontact voltage sensor probe tip using a liquid reference surface would be to determine the surface potential of the probe tip infrequently using a liquid reference surface, and then periodically measuring a stable, solid reference surface to monitor and correct for any change in the probe tip potential. In this case the surface potential of the solid reference surface could be recalibrated infrequently using the liquid half cell reference at the same time the surface potential of the noncontact voltage sensor probe tip is calibrated. If the solid reference surface is known to have a stable surface potential, then any change in measured CPD between the probe tip and stable reference surface after calibration using the liquid reference can be attributed to a change in the surface potential of the probe tip. If the potential of the probe tip and a stable solid reference surface are known at some point in time, and the change in CPD between the probe tip and the solid reference surface since that time is also known, then the current surface potential of the probe tip can be calculated.

Creating a solid reference surface with stable surface potential is a difficult problem. As already mentioned, environmental factors can significantly affect the work function and electrical potential of a surface. One proposed solution is to store reference surfaces in a controlled environment. The controlled environment could include controls for various environmental characteristics such as temperature, humidity and illumination. The controlled environment could also consist of a full or partial vacuum, or could be purged with a specific gas or gasses, such as nitrogen. In this case, the reference surface would normally be removed from the controlled environment for short periods of time to measure the CPD between the reference surface and the noncontact voltage sensor probe tip. Storing the reference surface in a controlled environment may result in a more stable work function, but it suffers from at least two drawbacks. First, the reference surface must be removed from the controlled environment for periodic measurements. Removing the reference surface from the controlled environment could induce changes in the reference surface potential. Second, if a change in CPD between the probe tip and the reference surface is detected, there is still some chance that the change is due to a change in the potential of the reference surface and not due to a change in the potential of the probe tip. There is no independent way of determining which surface has changed.

There is therefore an important need for easily providing an efficient, reliable method and system for surface potential calibration of a non-contact voltage sensor.

SUMMARY OF THE INVENTION

The system and methods described in this invention readily provide an enhanced application of a noncontact voltage sensor for making accurate and repeatable measurements of the electrical potential, or work function, of surfaces. The invention includes an enhanced capability for measuring and monitoring the surface potential of a non-contact voltage sensor probe tip. It also provides the ability to independently detect changes in the electrical potentials of the noncontact voltage sensor probe tip and various reference surfaces over time. The ability to accurately determine the surface potential of the noncontact voltage sensor probe tip allows the sensor to be used to measure the absolute potentials of other surfaces. This capability is useful for detecting changes in surface condition, including changes that result from surface contamination, charging of dielectric films on the surface, or changes in the work functions of films that may affect the performance of microelectronic devices.

The invention comprises one or more reference surfaces and a reference noncontact voltage sensor with a probe tip, where the reference surfaces and reference sensor probe tip are stored in a controlled environment. The invention also includes the ability to remove the reference noncontact voltage sensor probe tip from the controlled environment to make CPD measurements on nonreference surfaces that are not stored in the controlled environment, and then return the reference sensor probe tip to the controlled environment. The reference surfaces may include both liquid reference surfaces and solid reference surfaces. The liquid reference surfaces may include an electrochemical half cell in electrical contact with an electrolyte solution such that the surface potential of the electrolyte solution is equal to the electrical potential of the half cell.

The reference noncontact voltage sensor is used to measure the CPD between the reference sensor probe tip and the reference surfaces stored in the controlled environment. At least one of these reference surfaces has a known surface potential. The nonreference noncontact voltage sensor probe tip is then moved outside of the controlled environment and is used to measure the CPD between this probe tip and a nonreference surface. Then the CPD between the nonreference surface and a nonreference noncontact voltage sensor is measured. These CPD measurements are used to calculate the surface potential of the nonreference noncontact voltage sensor probe tip relative to the reference surfaces. This information is used to calculate the surface potential and work function of the nonreference sensor probe tip. Once the surface potential of the nonreference noncontact voltage sensor probe tip is known, the nonreference sensor can then be used to measure the CPD between the nonreference sensor probe tip and other surfaces. These measurements can be used to calculate the work function and surface potential of these other surfaces. This process can be repeated periodically to measure and correct for any change in the work function of the nonreference noncontact voltage sensor probe tip.

The controlled environment can take many different forms. A typical controlled environment would include an enclosure with controls for maintaining one or more constant environmental characteristics such as temperature, humidity, cleanliness, and illumination. All of these factors have been shown to influence surface work function. The controlled environment could also include the ability to purge the area around the reference surfaces and reference probe tip with specific gasses, or to create a full or partial vacuum around the reference surfaces and reference probe tip. Gasses can be chosen to minimize potential chemical reactions between the environment and reference surfaces and reference probe tip. Filters can be used to process the atmosphere in the controlled environment to reduce particulates or remove organic or other contaminants. The controlled environment can include one or more of the above controls alone or in combination.

The important innovation of this invention is the inclusion of both reference surfaces and a reference noncontact voltage sensor probe tip in a controlled environment. The use of a reference probe tip provides two important benefits. The first benefit is that the actual reference surfaces do not need to be removed from the controlled environment in order to perform CPD measurements on them. Removing the reference surfaces from the controlled environment would expose the surfaces to a new environment. This could cause surface chemical reactions or adsorption that may cause the work functions and surface potentials of the surfaces to change. Once the surface is disturbed, the surface condition and surface potential could continue to change over a period of minutes, hours or even days. Maintaining reference surfaces with stable surface potentials is critical to the accurate monitoring of the nonreference noncontact voltage sensor probe tip work function, which is one of the purposes of this invention. Of course removing the reference sensor probe tip from the controlled environment may cause the work function and surface potential of the reference sensor probe tip to change. However, these changes tend to occur slowly over a period of minutes. As long as the surface potential of the reference sensor probe tip is stable over the time between CPD measurements on the reference surfaces in the controlled environment and the nonreference surface outside of the controlled environment, then the relative surface potentials of the reference and nonreference surfaces can be determined accurately. This time between CPD measurements inside and outside of the controlled environment is typically less than one minute. If the surface potential of the reference sensor probe tip changes slowly between subsequent calibrations, this will have no effect on the accuracy of the calibrations because the surface potential of the nonreference voltage sensor probe tip is always calibrated relative to the stable work functions of the reference surfaces.

The second benefit of using a reference noncontact voltage sensor is that it allows the CPD to be determined separately between the reference sensor probe tip and 1) the reference surfaces in the controlled environment, and 2) the nonreference noncontact voltage sensor probe tip. If the nonreference noncontact voltage sensor probe tip is used to directly measure the CPD of the reference surfaces, any change in the CPD value could be the result of a change in surface potential of the nonreference sensor probe tip, the reference surfaces, or both. There is no way to know for sure which surface is changing. The use of a reference noncontact voltage sensor allows independent CPD measurements that can be used to help identify the source of any change in CPD between the nonreference sensor probe tip and reference surfaces. For example, if the CPD between a reference surface and the reference sensor probe tip is stable over multiple measurements, but the CPD between the reference sensor probe tip and the nonreference sensor probe tip changes, then the change can be attributed to a change in the surface potential of the nonreference sensor probe tip. This is the most common situation because the nonreference sensor probe tip operates in an uncontrolled environment. If the surface potential of the nonreference noncontact voltage sensor probe tip changes, then the new surface potential of the nonreference sensor probe tip can be recalculated based on the CPD between the nonreference noncontact voltage sensor probe tip and a reference surface with stable surface potential. However, if the CPD between the reference sensor probe tip and a reference surface changes, but the CPD between the reference sensor probe tip and the nonreference sensor probe tip is stable, this could indicate a change in the surface potential of the reference surface, and would require recalibrating all surface potentials using a reference surface with a known surface potential, such as an electrolyte solution in contact with a liquid electrochemical half cell.

In order to maintain reference surfaces at a constant surface potential, it is necessary to store them in a stable environment. This is accomplished by storing them in an enclosure with environmental controls. The enclosure is designed such that removing the reference noncontact voltage sensor probe tip from the enclosure does not disturb the controlled environment. For example, the enclosure can include a small hole that is open only when the reference sensor probe tip is making CPD measurements on a nonreference surface outside of the enclosure. Also, the interior of the enclosure can be maintained at a higher pressure than the exterior of the enclosure so the probe tip can exit the enclosure through the hole without external gasses entering the enclosure. When the reference sensor probe tip is removed from the controlled environment, this may cause the surface potential of the probe tip to change. However, such changes tend to occur relatively slowly, and will not have a significant effect on the surface potential of the reference sensor probe tip prior to measuring the CPD between the reference sensor probe tip and a nonreference surface outside of the controlled environment. Any subsequent change in reference sensor probe tip surface potential will not affect subsequent surface potential calibrations because the nonreference voltage sensor probe tip is always calibrated relative to the surface potentials of the stable work function reference surfaces.

Other features and advantages of the invention will become apparent from the following description of preferred embodiments taken in conjunction with the accompanying drawings described below.

DETAILED DESCRIPTION OF THE PREFERRED EMBODIMENTS

Figure 1:
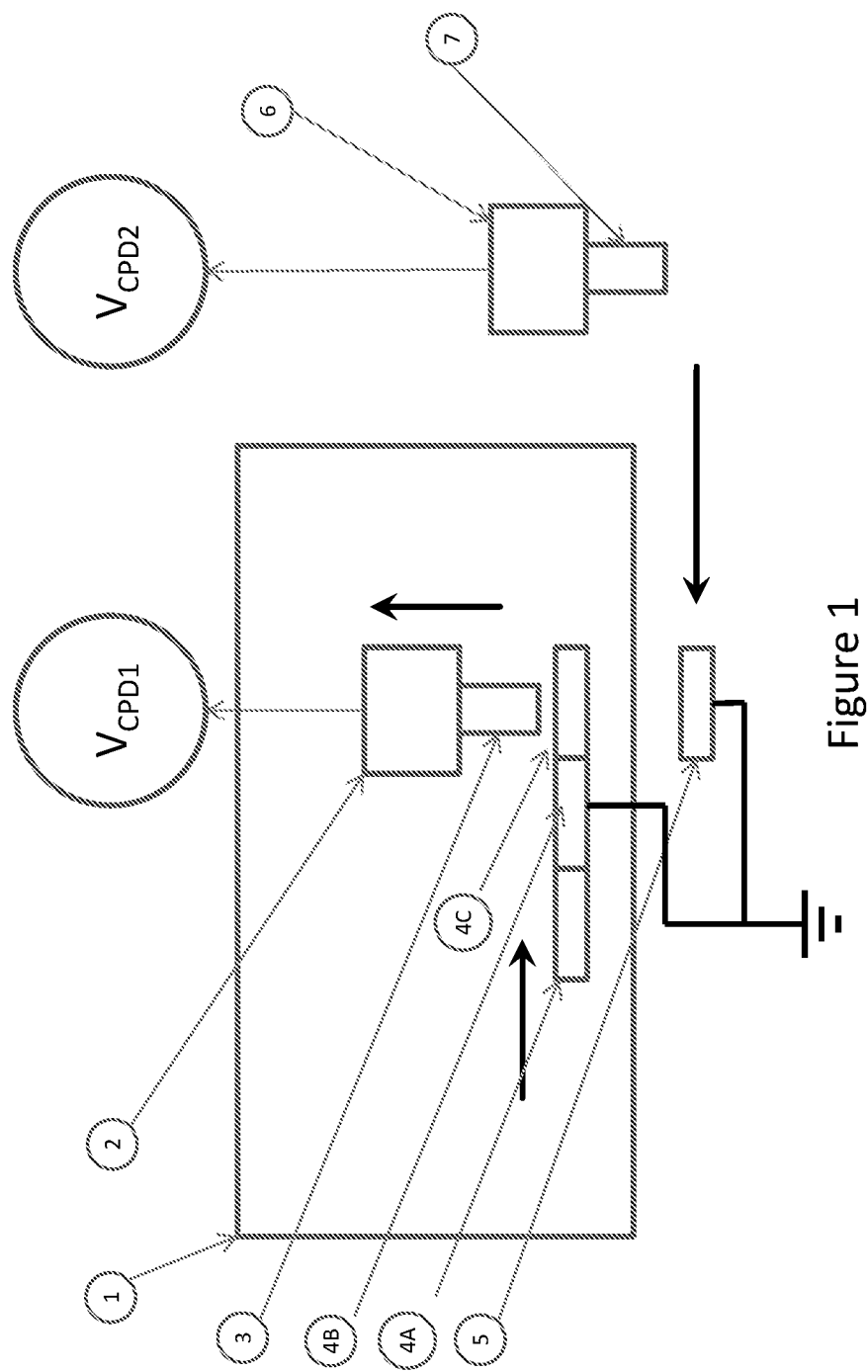
FIG. 1 shows the reference noncontact voltage sensor probe tip in the controlled environment, positioned to measure the Contact Potential Difference between the probe tip and one of three reference surfaces.
Figure 2:
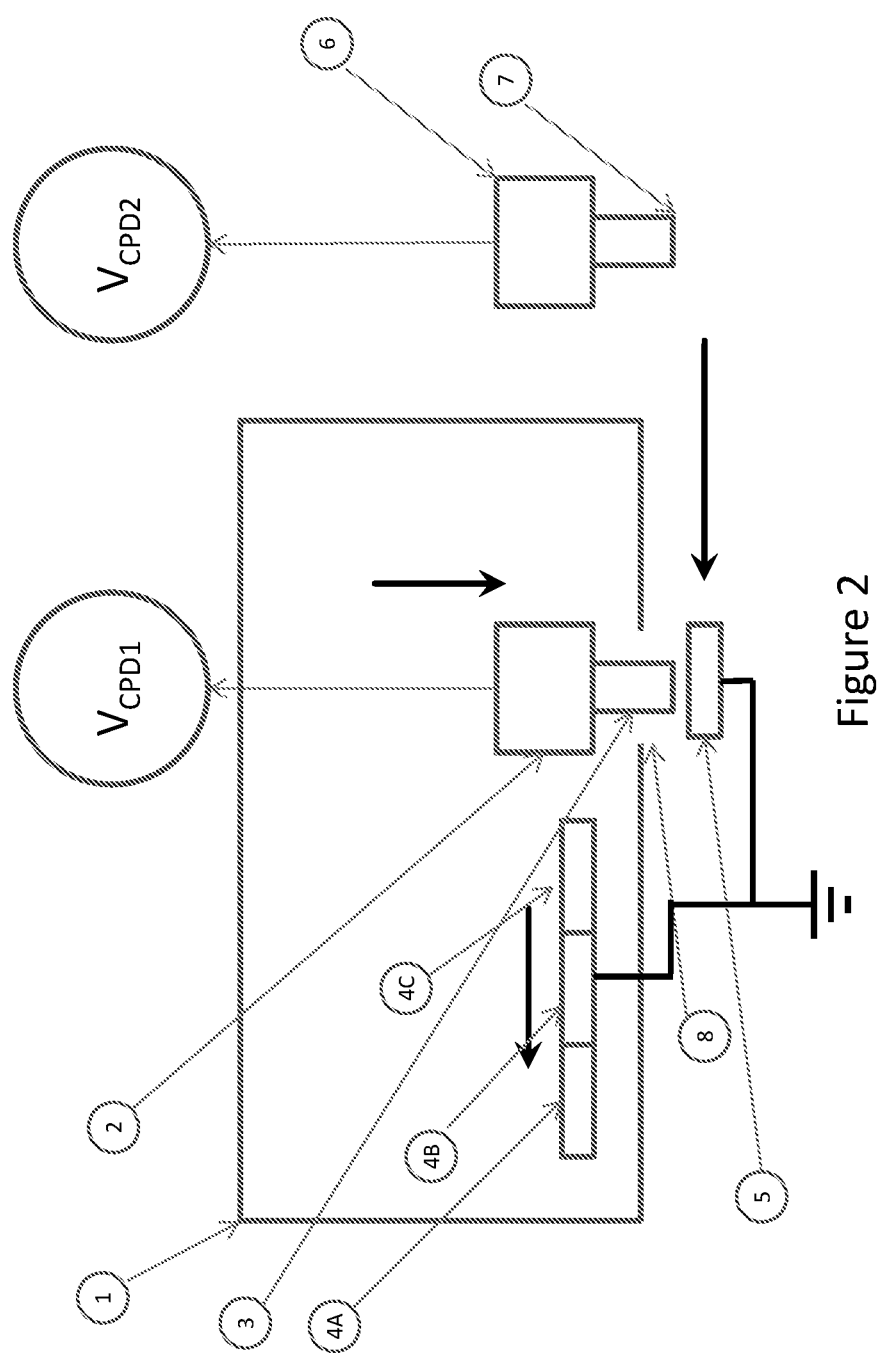
FIG. 2 shows the reference noncontact voltage sensor probe tip outside the controlled environment, positioned to measure the Contact Potential Difference between the probe tip and a nonreference surface.

In one preferred embodiment of the invention, one or more reference surfaces 4A-C with known and/or stable surface potentials are stored in an enclosure 1 with a controlled environment. As shown in FIG. 1, a reference noncontact voltage sensor 2 with a probe tip 3 is also stored in the enclosure 1. The environment inside the enclosure 1 is controlled to minimize variations that could affect the surface potentials of surfaces 3 and 4 stored in the enclosure 1. The environmental controls include controlled temperature, humidity, illumination, environmental gasses, and cleanliness. In the preferred embodiment, the system includes the ability to move each of the reference surfaces 4A-C under the reference noncontact sensor probe tip 3 so that the CPD between the reference sensor probe tip 3 and each of the reference surfaces 4A-C can be measured. As shown in FIG. 2, the reference surfaces 4A-C can also be moved out from under the reference noncontact voltage sensor probe tip 3, and the probe tip 3 can be moved so that the probe tip 3 passes through a hole 8 in the enclosure 1 and can be positioned above a nonreference surface 5 to measure the CPD between the probe tip 3 and the nonreference surface 5. In the preferred embodiment, the hole 8 in the enclosure 1 is opened so that the probe tip 3 can move outside of the enclosure 1 and then closed after the probe tip 3 is moved back into the enclosure 1.

The reference surfaces 4A-C in the enclosure 1 includes either or both liquid and solid reference surfaces. In a preferred embodiment, the reference surfaces 4A-C include an electrochemical half cell liquid reference in contact with an electrolyte solution. The electrolyte solution has a surface potential equal to the stable and known half cell potential. This electrolyte surface with known surface potential is used to calibrate the surface potentials of the noncontact voltage sensor probe tips 3 and 7 and solid reference surfaces. Surface potential calibration using the liquid reference is performed infrequently, for example every few weeks or months, or as needed. The system also includes one or more solid reference surfaces with relatively stable surface potentials that are used for frequent monitoring and calibration of the nonreference sensor probe tip 7 surface potential. The solid reference surfaces can be used to recalibrate the surface potential of the nonreference probe tip 7 every few minutes, hours, or days; or as needed.

Figure 3:
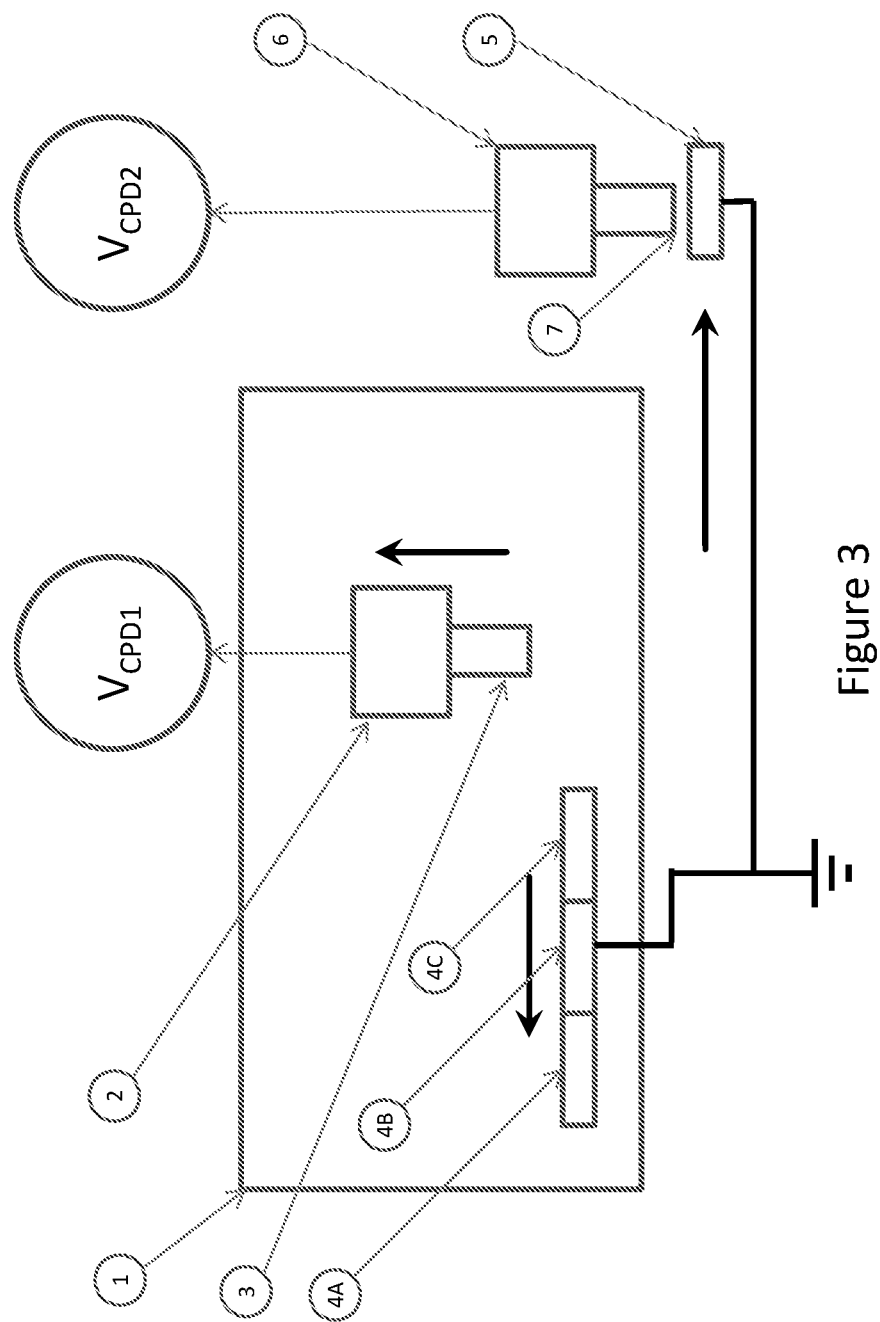
FIG. 3 shows the nonreference surface positioned to measure the Contact Potential Difference between the nonreference noncontact voltage sensor probe tip and the nonreference surface.

Prior to using the nonreference noncontact voltage sensor to measure the surface potential of a surface, the system first performs an initialization step to determine the surface potentials of each of the reference surfaces 4A-C and the nonreference noncontact voltage sensor probe tip 7 (FIG. 1). This requires a reference surface with known surface potential. In this preferred embodiment, this surface potential reference is a liquid electrolyte solution that is in contact with an electrochemical half cell. An electrochemical half cell consists of an electrode and electrolyte combination. Under controlled conditions, the electrical potential produced by the half cell is stable and repeatable. An electrolyte solution in electrical contact with the half cell has a surface potential that is equal to the half cell potential. This electrolyte solution provides a surface with a repeatable and known electrical potential. The liquid half cell reference surface requires some preparation to insure the cell is free of contamination and has the correct amount of liquid solution. Once the liquid half cell reference has been prepared, the CPD between the reference sensor probe tip 3 and this liquid reference surface is measured. The reference sensor probe tip 3 is then moved through a hole in the enclosure 8 and positioned above a nonreference surface 5 (FIG. 2). The CPD between the reference sensor probe tip 3 and nonreference surface 5 is measured. As shown in FIG. 3, the reference sensor probe tip 3 is then moved back into the enclosure 1 and the hole 8 is closed. The nonreference surface 5 is then positioned under the nonreference sensor probe tip 7 and the CPD between the nonreference surface 5 and nonreference probe tip 7 is measured. The CPD measurements are then used to calculate the surface potential of the nonreference noncontact voltage sensor probe tip 7 relative to the reference surface with known surface potential. This information is then used to calculate the surface potential of the nonreference sensor probe tip. The CPD between the reference sensor probe tip 3 and each of the other work reference surfaces 4A-C is also measured. In this preferred embodiment, the other reference surfaces 4A-C are solid conductive or semiconductive materials that have relatively stable surface potentials. The CPD measurements are used to calculate the surface potentials of each of these reference surfaces 4A-C.

Once the initialization step is complete, the surface potentials of the nonreference noncontact voltage sensor probe tip 7 and each of the reference surfaces 4A-C are known. The nonreference noncontact voltage sensor 6 can then be used to measure the CPD between the nonreference sensor probe tip and other surfaces. Since the surface potential of the nonreference sensor probe tip is known, this information can be used to calculate the surface potentials of the measured surfaces.

After initialization, the method and system can be used to perform periodic recalibrations of the surface potential of the nonreference noncontact voltage sensor probe tip 7 using one or more stable reference surfaces 4A-C stored in the controlled environment 1. It is not necessary to use the liquid reference surface or any other reference surface with known surface potential that requires preparation, as long as the surface potential of the reference surface used is stable.

In this preferred embodiment, the surface potential of the nonreference noncontact voltage sensor probe tip 7 can be recalibrated as follows. First, the reference sensor probe tip 3 is positioned above a stable reference surface 4 and the CPD between the reference sensor probe tip 3 and the reference surface 4 is measured. The reference sensor probe tip 3 is then moved through a hole in the enclosure 8 and positioned above a nonreference surface 5. The CPD between the reference sensor probe tip 3 and nonreference surface 5 is measured. The reference sensor probe tip 3 is then moved back into the enclosure 1 and the hole 8 is closed. The nonreference surface 5 is then positioned under the nonreference sensor probe tip 7 and the CPD between the nonreference surface 5 and the nonreference sensor probe tip 7 is measured. These CPD measurements are used to calculate the CPD between the nonreference sensor probe tip 7 and the reference surface 4. This CPD is compared to the previously calculated CPD. The change in CPD is used to calculate a new surface potential for the nonreference non-contact voltage sensor probe tip 7.

In this preferred embodiment, each time a recalibration is performed, the change in CPD between the reference sensor probe tip 3 and the reference surface 4 is calculated. The change in CPD between the reference sensor probe tip 3 and the reference surface 4 is compared to the change in CPD between the reference sensor probe tip 3 and the nonreference sensor probe tip 7. If the change in CPD between the reference sensor probe tip 3 and the reference surface 4 is larger than the change in surface potential between the reference sensor probe tip 3 and the nonreference sensor probe tip 7, then the surface potentials of the reference sensor probe tip 3, the reference surfaces 4A-C, and the nonreference sensor probe tip 7 are all recalibrated using the liquid electrochemical half cell reference surface or some other reference surface with known surface potential.

Figure 4:
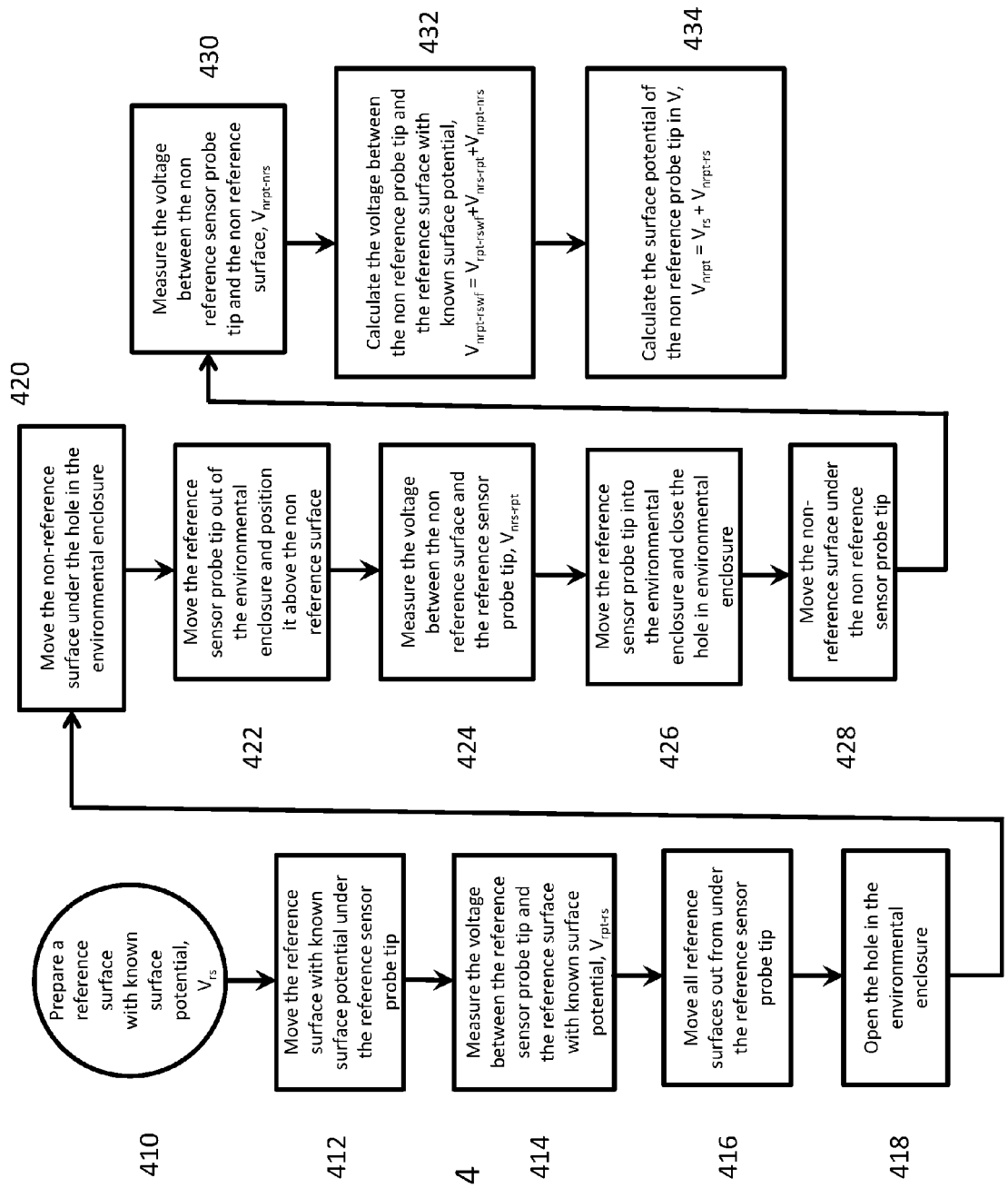
FIG. 4 shows a flow chart of the steps required to determine the surface potential of the nonreference noncontact voltage sensor probe tip using a reference surface with known surface potential.

FIG. 4 shows a flow chart of the steps required to determine the surface potential of the nonreference noncontact voltage sensor probe tip using a reference surface with known surface potential. At step 410, prepare a reference surface ith known surface potential, $V_{rs}$. At step 412, move the reference surface with known surface potential under the reference sensor probe tip. At step 414, measure the voltage between the reference sensor probe tip and the reference surface with known surface potential, $V_{rpt-rs}$. At step 416, move all reference surfaces out from under the reference sensor probe tip. At step 418, open the hole in the environmental enclosure. At step 420, move the non-reference surface under the hole in the environmental enclosure. At step 422, move the reference sensor probe tip out of the environmental enclosure and position it above the non reference surface. At step 424, measure the voltage between the non reference surface and the reference sensor probe tip, $V_{nrs-rpt}$. At step 426, move the reference sensor probe tip into the environmental enclosure and close the hole in environmental enclosure. At step 428, move the non-reference surface under the non reference sensor probe tip. At step 430, measure the voltage between the non reference sensor probe tip and the non reference surface, $V_{nrpt-nrs}$. At step 432, calculate the voltage between the non reference probe tip and the reference surface with known surface potential, $V_{nrpt-rswf}=V_{rpt-rswf}+V_{nrs-rpt}+V_{nrpt-nrs}$. At step 434, calculate the surface potential of the non reference probe tip in V, $V_{nrpt}=V_{rs}+V_{nrpt-rs}$.

Figure 5:
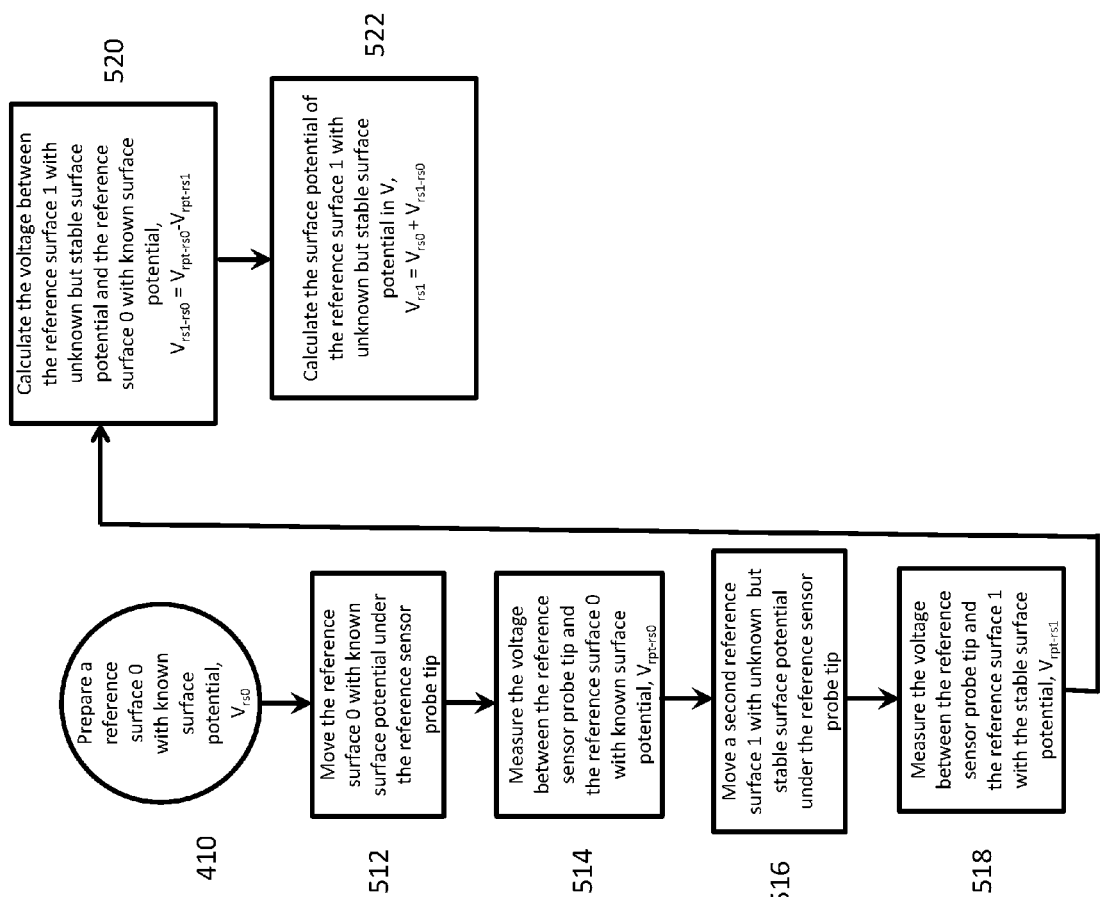
FIG. 5 shows a flow chart of the steps required to determine the surface potential of a stable reference surface using a reference surface with known surface potential.

FIG. 5 shows a flow chart of the steps required to determine the surface potential of a stable reference surface using a reference surface with known surface potential. At step 510, prepare a reference surface 0 with known surface potential, $V_{rs0}$. At step 512, move the reference surface 0 with known surface potential under the reference sensor probe tip. At step 514, measure the voltage between the reference sensor probe tip and the reference surface 0 with known surface potential, $V_{rpt-rs0}$. At step 516, move a second reference surface 1 with unknown but stable surface potential under the reference sensor probe tip. At step 518, measure the voltage between the reference sensor probe tip and the reference surface 1 with the stable surface potential, $V_{rpt-rs1}$. At step 520, calculate the voltage between the reference surface 1 with unknown but stable surface potential and the reference surface 0 with known surface potential, $V_{rs1-rs0}=V_{rpt-rs0}-V_{rpt-rs1}$. At step 522, calculate the surface potential of the reference surface 1 with unknown but stable surface potential in V, $V_{rs1}=V_{rs0}+V_{rs1-rs0}$.

Figure 6:
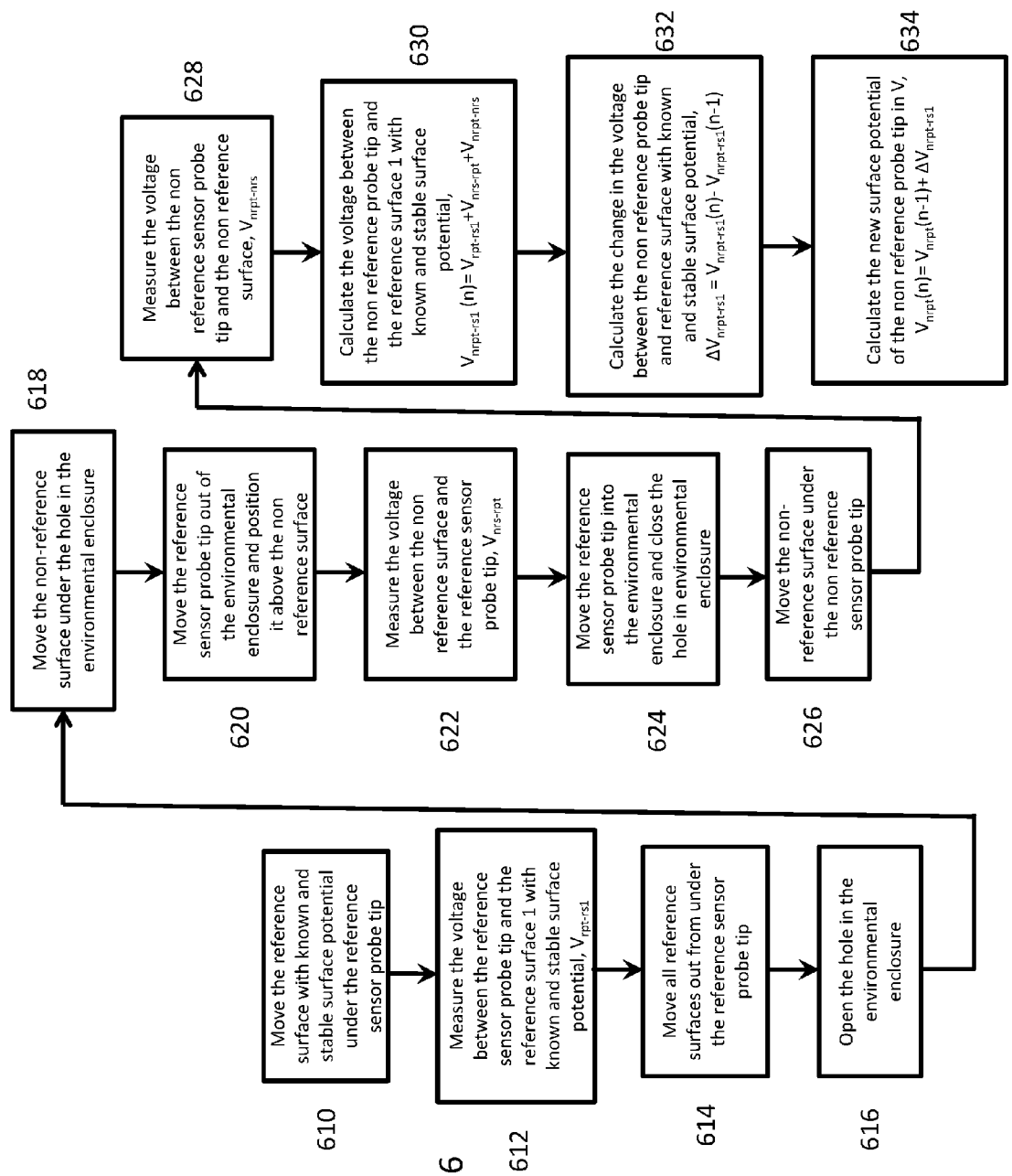
FIG. 6 shows a flow chart of the steps required to periodically monitor and correct for changes in the surface potential of the nonreference noncontact voltage sensor probe tip.

FIG. 6 shows a flow chart of the steps required to periodically monitor and correct for changes in the surface potential of the nonreference noncontact voltage sensor probe tip. At step 610, move the reference surface with known and stable surface potential under the reference sensor probe tip. At step 612, measure the voltage between the reference sensor probe tip and the reference surface 1 with known and stable surface potential, $V_{rpt-rs1}$. At step 614, move all reference surfaces out from under the reference sensor probe tip. At step 616, open the hole in the environmental enclosure. At step 618, move the non-reference surface under the hole in the environmental enclosure. At step 620, move the reference sensor probe tip out of the environmental enclosure and position it above the non reference surface. At step 622, measure the voltage between the non reference surface and the reference sensor probe tip, $V_{nrs-rpt}$. At step 624, move the reference sensor probe tip into the environmental enclosure and close the hole in environmental enclosure. At step 626, move the non-reference surface under the non reference sensor probe tip. At step 628, measure the voltage between the non reference sensor probe tip and the non reference surface, $V_{nrpt-nrs}$. At step 630, calculate the voltage between the non reference probe tip and the reference surface 1 with known and stable surface potential, $V_{nrpt-rs1}(n)=V_{rpt-rs1}+V_{nrs-rpt}+V_{nrpt-nrs}$. At step 632, calculate the change in the voltage between the non reference probe tip and reference surface with known and stable surface potential, $\Delta V_{nrpt-rs1}=V_{nrpt-rs1}-V_{nrpt-rs1}(n-1)$. At step 634, calculate the new surface potential of the non reference probe tip in V, $V_{nrpt}(n)=V_{nrpt}(n-1)+\Delta V_{nrpt-rs1}$.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method for calibrating work function or surface potential of a non-contact voltage sensor probe tip, comprising:

preparing one or more reference samples and a reference non-contact voltage sensor probe tip to have stable surface potentials;

establishing a controlled environment around the one or more reference samples and the reference non-contact voltage sensor probe tip;

producing a first set of voltage measurements between the one or more reference samples and the reference non-contact voltage sensor probe tip;

removing the reference non-contact voltage sensor probe tip from the controlled environment and placing it adjacent a non-reference sample surface;

producing a second voltage measurement between the reference non-contact voltage sensor probe tip and a selected point on the non-reference sample surface using the reference non-contact voltage sensor probe tip;

returning the reference non-contact voltage sensor probe tip to the controlled environment subsequent to the second voltage measurement;

producing a third voltage measurement between the selected point on the non-reference sample surface using a non-reference non-contact voltage sensor probe tip, and determining surface potential or work function for the non-reference non-contact voltage sensor probe tip from the first voltage measurement, the second voltage measurement, and the third voltage measurement.

2. The method of claim 1, wherein the step of determining the surface potential or work function of the non-reference non-contact voltage sensor probe tip comprises calculating a first set of calculated voltages between the one or more reference samples and the non-reference non-contact voltage sensor probe tip.

3. The method in claim 2, wherein the step of determining the surface potential or work function of the non-reference non-contact voltage sensor probe tip comprises determining the difference between the first set of calculated voltages and a predetermined set of calculated voltages.

4. The method of claim 1, wherein the step of controlling the environment around the one or more reference samples and the reference non-contact voltage sensor probe tip comprises exposing an isolated chamber which is storing the one or more reference samples and the reference non-contact voltage sensor probe tip to at least one environmental parameter.

5. The method of claim 1, wherein the step of controlling the environment around the one or more reference samples and the reference non-contact voltage sensor probe tip comprises storing the reference samples in an isolated area.

6. The method of claim 1, wherein the step of controlling the environment around the one or more reference samples and the reference non-contact voltage sensor probe tip comprises purging an area around the one or more reference samples and the reference non-contact voltage sensor probe tip with an inert gas.

7. The method of claim 1, wherein the step of controlling the environment around the one or more reference samples and the reference non-contact voltage sensor probe tip comprises controlling the illumination of the one or more reference samples and the reference non-contact voltage sensor probe tip.

8. The method of claim 1, wherein the step of controlling the environment around the one or more reference samples and the reference non-contact voltage sensor probe tip comprises inducing a vacuum about the one or more reference samples and the reference non-contact voltage sensor probe tip.

9. The method of claim 1, wherein the step of controlling the environment around the one or more reference samples and the reference non-contact voltage sensor probe tip comprises maintaining the controlled environment at a constant temperature and humidity.

10. The method of claim 1, wherein at least one of the one or more reference samples is a liquid surface of an electrolyte solution in electrical contact with an electrochemical half-cell.

* * * * *